United States Patent [19]
Parker et al.

[11] Patent Number: 5,256,989
[45] Date of Patent: Oct. 26, 1993

[54] LOCK DETECTION FOR A PHASE LOCK LOOP

[75] Inventors: Lanny L. Parker, Mesa; Ahmad H. Atriss, Chandler; Benjamin C. Peterson, Tempe, all of Ariz.; Dean W. Mueller, Portland, Oreg.

[73] Assignee: Motorola, Inc., Schaumburg, Ill.

[21] Appl. No.: 695,118

[22] Filed: May 3, 1991

[51] Int. Cl.⁵ .............................................. H03L 7/00
[52] U.S. Cl. ............................... 331/1 A; 331/DIG. 2
[58] Field of Search ............. 331/1 A, 11, 25, DIG. 2

[56] References Cited
U.S. PATENT DOCUMENTS
4,787,097 11/1988 Rizzo ........................ 331/DIG. 2 X Primary Examiner—Robert J. Pascal
Attorney, Agent, or Firm—Robert D. Atkins

[57] ABSTRACT

A phase lock loop monitors a first digital signal and generates a second digital signal operating substantially at frequency and in-phase with the first digital signal. The first and second digital signal are applied to a lock detection circuit for generating a first digital output signal having a first logic state from a mutually exclusive combination of the first and second digital signals. The first logic state of the first digital output signal is compared with a time slot window formed by a control signal for generating a true lock detection signal when the first logic state of the first digital output signal occurs within the time slot window and a false lock detection signal when the first logic state of the first digital output signal occurs outside the time slot window.

14 Claims, 6 Drawing Sheets

NODE 34

NODE 36

NODE 42

NODE 44

NODE 50

NODE 70

NODE 80

NODE 90

TIME SLOT

OSCOUT

SAMPLE CLOCK

LOCK DETECTION FOR A PHASE LOCK LOOP

CROSS REFERENCE TO RELATED PATENT APPLICATIONS

This application is related to copending U.S. patent application Ser. No. 07/705,861, entitled "CIRCUIT AND METHOD OF SWITCHING BETWEEN REDUNDANT CLOCKS FOR A PHASE LOCK LOOP", filed May 28, 1991, by Lanny Parker et al and assigned to the same assignee, Codex, Corp. This application is further related to copending U.S. patent application Ser. No. 07/705,862, entitled "CIRCUIT AND METHOD OF DETECTING AN INVALID CLOCK SIGNAL", filed May 28, 1991, by Lanny Parker et al and assigned to the same assignee, Codex, Corp.

FIELD OF THE INVENTION

This invention relates in general to phase lock loops and, more particularly, to a phase lock loop with a phase lock detection feature.

BACKGROUND OF THE INVENTION

Phase lock loops (PLLs) are found in a myriad of electronic applications such as communication receivers and clock synchronization circuits for computer systems. A conventional PLL comprises a phase detector for monitoring the phase difference between an input signal and an output signal of a voltage controlled oscillator (VCO) and generating an up control signal and a down control signal for a charge pump circuit which charges and discharges the loop filter at the input of the VCO. The up and down control signals drive the VCO to maintain a predetermined phase relationship between the signals applied to the phase detector, as is well understood.

It is common for the PLL to lose phase lock should the input signal fade or jump to a radically different frequency of operation. The out-of-lock state can be detected with a lock detection circuit and the system processing suspended until the PLL can re-achieve phase lock. Most, if not all, such lock detection schemes monitor the up control signal and the down control signal at the output of the phase detector to ascertain the lock status of the PLL. If the up control signal and down control signal are not pulsing, then loop node voltage remains substantially constant and the PLL should be in phase lock. When the up control signal and the down control signal are steadily generating pulses charging or discharging the loop filter to adjust the input voltage of the VCO, the loop must be in motion and thus out of phase lock.

During normal operation, the loop node is continuously subjected to leakage through the charge pump circuit thus requiring occasional pulses to maintain the voltage controlling the VCO. However, these intermittent pulses should not indicate an out-of-lock condition. The conventional lock detection circuit typically includes a delay circuit comprising, for example, a string of serially coupled inverters designed to ignore short intermittent pulses from the phase detector having less than a predetermined pulse width. The up and down control signals must have a pulse width as least as long as the delay circuit to trigger an out-of-lock signal. Unfortunately, the pulse widths of the up and down control signals are subject to temperature and process variation and therefore are not well suited as control parameters for ascertaining phase lock. The pulse widths of the up and down control signals are merely rough indicators having limited accuracy of the true phase relationship between the input signals of the phase detector.

Hence, what is needed is an improved lock detection circuit for a PLL which directly monitors the input signals of the phase detector to determine the lock status of the loop.

SUMMARY OF THE INVENTION

Briefly stated, the present invention comprises a lock detection circuit including a first circuit responsive to first and second digital input signals for generating a first digital output signal having a first logic state from a mutually exclusive combination of the first and second digital input signals, and a second circuit for comparing the first logic state of the first digital output signal with a time slot window formed by a control signal and generating a true lock detection signal when the first logic state of the first digital output signal occurs within the time slot window and a false lock detection signal when the first logic state of the first digital output signal occurs outside the time slot window.

In another aspect the present invention is a phase lock loop comprising a first circuit for comparing the phase of first and second digital input signals and generating an output signal to charge and discharge a loop node. A voltage controlled oscillator has an input coupled for receiving the output signal of the first circuit and providing a signal operating at a frequency as determined by the output signal of the first circuit while a second circuit has an input coupled for receiving the signal from the voltage controlled oscillator and dividing down the frequency thereof for providing the second digital input signal to the first circuit. A lock detection circuit includes a first input coupled for receiving the first digital input signal, a second input coupled for receiving the second digital input signal, a third input coupled for receiving a control signal forming a time slot window, and an output providing a true lock detection signal when a mutually exclusive combination of the first and second digital input signals occurs within the time slot window and a false lock detection signal when the mutually exclusive combination of the first and second digital input signals occurs outside the time slot window.

DETAILED DESCRIPTION OF THE PREFERRED EMBODIMENT

Figure 1:
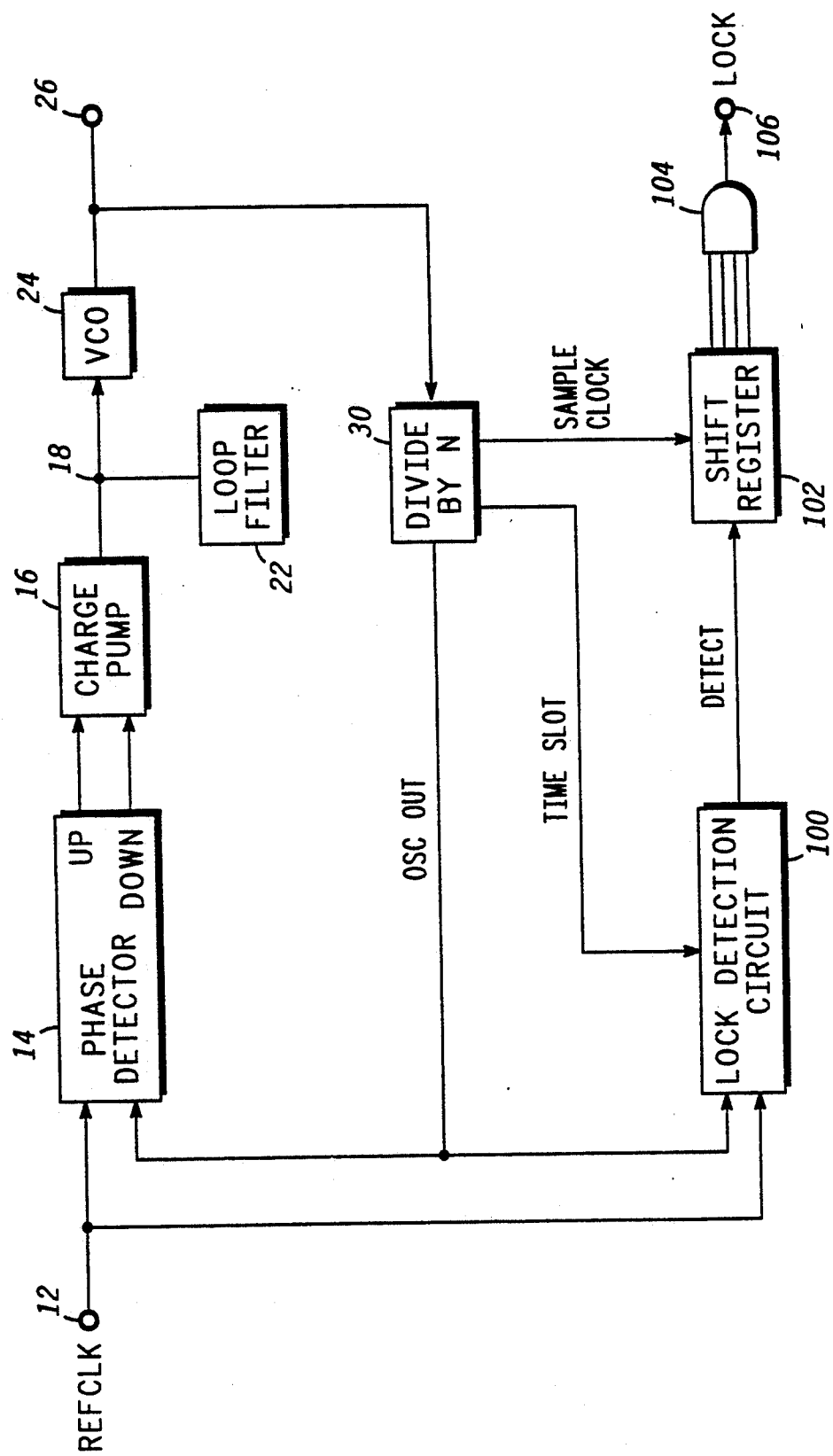
FIG. 1 is a block diagram illustrating a phase lock loop with lock detection.

A phase lock loop (PLL) 10 in accordance with the present invention is shown in FIG. 1 suitable for manufacturing as an integrated circuit using conventional integrated circuit processes. One usage for PLL 10 is in a communication system such as a telecommunications network manager. A REFCLK signal is applied at input 12 at the first input of phase detector 14 which generates an UP control signal and a DOWN control signal for charge pump 16. Charge pump 16 may comprise a P-channel transistor and an N-channel transistor (not shown) serially coupled between a positive power supply conductor and ground potential, wherein the P-channel transistor is responsive to the UP control signal and the N-channel transistor is responsive to the DOWN control signal. The interconnection at the drains of the charge pump transistors drives loop node 18 for charging and discharging loop filter 22 which may comprise a capacitor (not shown) coupled between loop node 18 and ground potential. The voltage at loop node 18 controls VCO 24 for generating an oscillator signal at output 26. The oscillator signal of VCO 24 is divided through divide-by-N circuit 30 for providing an OSCOUT signal which is applied at the second input of phase detector 14.

The operation of PLL 10 proceeds as follows. The REFCLK signal applied at the first input of phase detector 14 in combination with the OSCOUT signal applied at the second input of the same generates an UP control signal, or the DOWN control signal, according to the phase relationship therebetween. The UP control signal pulses if the OSCOUT signal lags the REFCLK signal, i.e, the frequency of the OSCOUT signal is too low relative to the REFCLK signal. Alternately, the DOWN control signal pulses to reduce the frequency of the oscillator signal from VCO 24 if the OSCOUT signal leads the REFCLK signal. Charge pump 16 is responsive to the UP control signal and the DOWN control signal for charging and discharging loop node 18 under the influence of loop filter 22. The voltage developed at loop node 18 drives VCO 24 to generate the 24 MHz VCO oscillator signal which is divided down by divide-by-N circuit 30 for providing the OSCOUT signal at the second input of phase detector 14. A typical value for "N" in divide-by-N circuit 30 is six. Thus, phase detector 14 monitors the phase difference between the REFCLK signal and the OSCOUT signal and generates UP and DOWN control signals as necessary for charge pump 16 to drive loop node 18 and VCO 24 to maintain a predetermined phase relationship between the REFCLK and OSCOUT signals.

Figure 2:
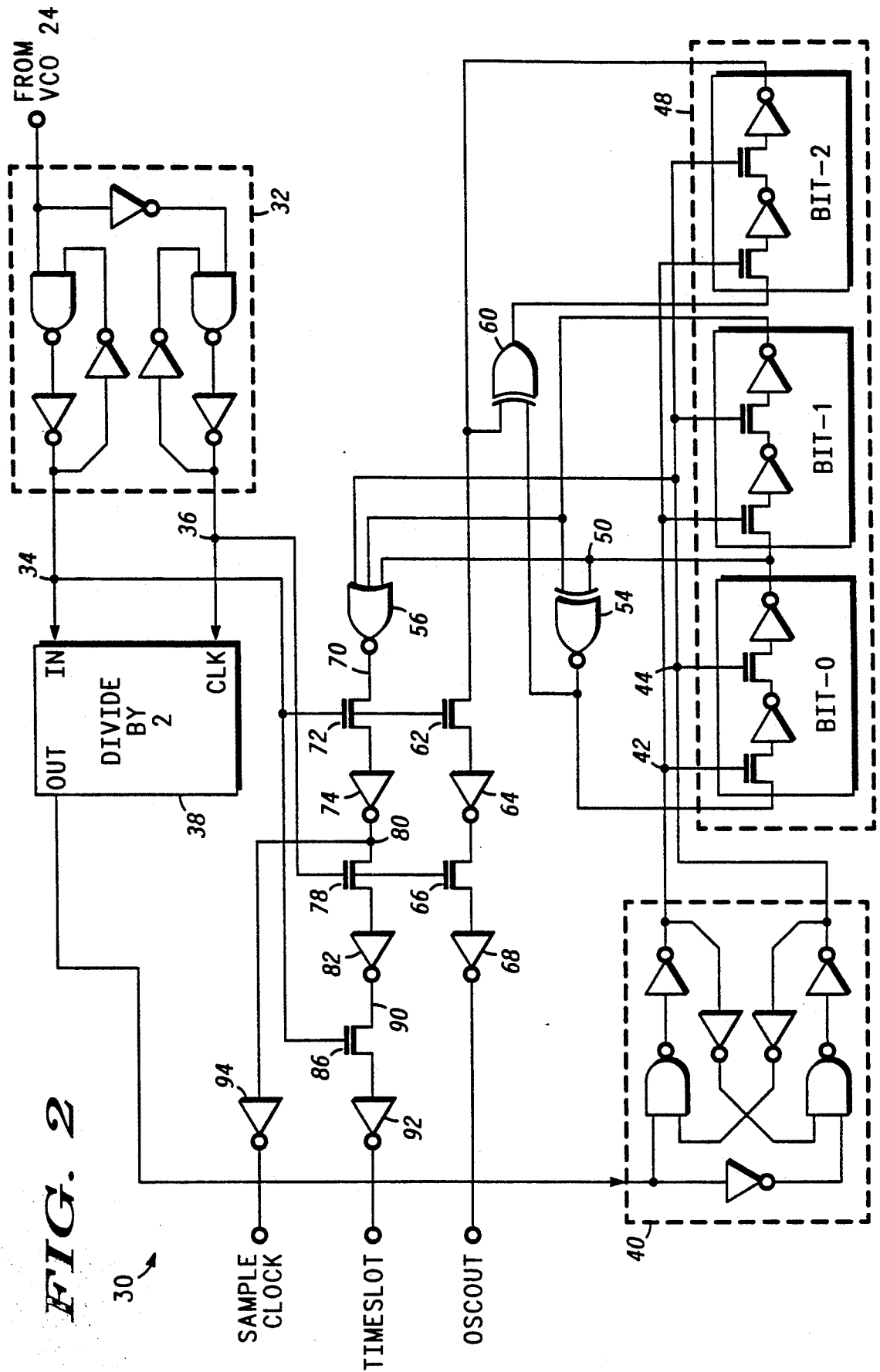
FIG. 2 is a schematic diagram illustrating a divide-by-N circuit for generating TIMESLOT and SAMPLE—CLOCK signals.
Figure 3A:
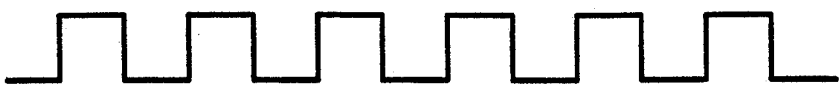
FIGS. 3A-3K are waveform plots illustrating the operation of the divide-by-N circuit.
Figure 3B:
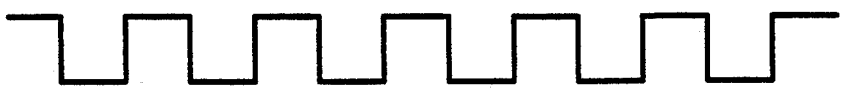
Figure 3C:
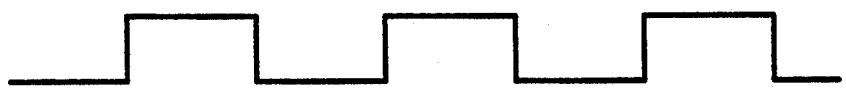
Figure 3D:
Figure 3E:
Figure 3F:
Figure 3G:
Figure 3H:
Figure 3I:
Figure 3J:
Figure 3K:

Further detail of divide-by-N circuit 30 is shown in FIG. 2 including circuit 32 for generating complementary, non-overlapping clock signals at nodes 34 and 36 from the oscillator signal of VCO 24 as illustrated in FIGS. 3A and 3B. The in-phase clock signal from node 34 is divided down through divide-by-2 circuit 38 and again spilt by circuit 40 into complementary, non-overlapping clock signals at nodes 42 and 44 as shown in FIGS. 3C and 3D. The non-overlapping clock signals are never logic one at the same time. The clock signals at nodes 42 and 44 control 3-bit shift register 48, wherein the bit 0, bit 1 and bit 2 sections of shift register 48 each include first and second inverters and first and second transistors responsive to the non-overlapping clock signals as shown in FIG. 2. The output of the bit 0 section at node 50 (FIG. 3E) is applied at the first inputs of exclusive-NOR gate 54 and NOR gate 56, while the second inputs of the same are coupled to the output of the bit 1 section. NOR gate 56 also includes a third input coupled to node 44. The output of exclusive-NOR gate 54 is coupled to the input of the bit 0 section and to the first input of exclusive-OR gate 60. The output of exclusive-OR gate 60 is coupled to the input of the bit 2 section of shift register 48, the output of which is coupled to the second input of exclusive-OR gate 60 and to the drain of transistor 62. The source of transistor 62 is coupled through inverter 64 to the drain of transistor 66, and the source of transistor 66 is coupled through inverter 68 for providing the OSCOUT signal, see FIG. 3J. Node 70 at the output of NOR gate 56 is coupled to the drain of transistor 72 which includes a source coupled through inverter 74 to the drain of transistor 78 at node 80. The source of transistor 78 is coupled through inverter 82 to the drain of transistor 86 at node 90 (FIG. 3H), and the source of transistor 86 is coupled through inverter 92 for providing a TIMESLOT signal as shown in FIG. 3I. The gates of transistors 66 and 78 are coupled to node 36 for receiving the complemented clock signal from circuit 32, while the gates of transistors 62, 72 and 86 are coupled to node 34 for receiving the in-phase clock signal. The signal at node 80 (FIG. 3G) is inverted by inverter 94 for providing a SAMPLE_CLOCK signal in FIG. 3K.

Exclusive-NOR gate 54 and exclusive-OR gate 60 provide the inputs to 3-bit shift register 48 for a divide-by-six operation including the following states:

| State | Bit 2 | Bit 1 | Bit 0 |
| --- | --- | --- | --- |
| 1 | 0 | 0 | 0 |
| 2 | 1 | 0 | 1 |
| 3 | 1 | 1 | 0 |
| 4 | 1 | 0 | 0 |
| 5 | 0 | 0 | 1 |
| 6 | 0 | 1 | 0 |
| 1 | 0 | 0 | 0 |

The TIMESLOT signal operates at twice the frequency of the OSCOUT signal with its low state centered about the transitions of the OSCOUT signal. The low state of the TIMESLOT signal defines a TIMESLOT window having a duration of say 20 nanoseconds compared to the overall period of the REFCLK signal of 250 nanoseconds. The SAMPLE_CLOCK signal operates at the same frequency as the TIMESLOT signal with a positive pulse just prior to the falling edge of the TIMESLOT signal. The frequency dividing function of divide-by-N circuit 30 is optional in PLL 10. It may not be necessary to divide the operating frequency of VCO 24 depending upon the particular application.

Returning to FIG. 1, the REFCLK signal and the OSCOUT signal are also applied at the first and second inputs of lock detection circuit 100. The TIMESLOT signal from divide-by-N circuit 30 is also applied to lock detector circuit 100 for generating a DETECT signal when the phase difference between the REFCLK signal and the OSCOUT signal is outside the window of the TIMESLOT signal. The TIMESLOT window is defined as the low state of the TIMESLOT signal. The DETECT signal from lock detection circuit 100 is applied at the data input of 4-bit- shift register 102 while the SAMPLE_CLOCK signal from divide-by-N circuit 30 is applied at the clock input of the same. The outputs of shift register 102 are coupled to the inputs of AND gate 104 for providing a LOCK signal at output 106. It takes only one false DETECT signal (logic zero) shifting into shift register 102 to drive the LOCK signal low by the logical operation of AND gate 104 indicating a out-of-lock condition. The DETECT signal must return to the true state (logic one) for at least four SAMPLE_CLOCK signal periods to completely shift the logic zero out of 4-bit shift register 102 and re-establish a true state for the LOCK signal. It is understood that shift register 102 can be made wider, say 12 bits or more, to increase the number of consecutive true DETECT signals necessary to issue a true LOCK signal.

Figure 4:
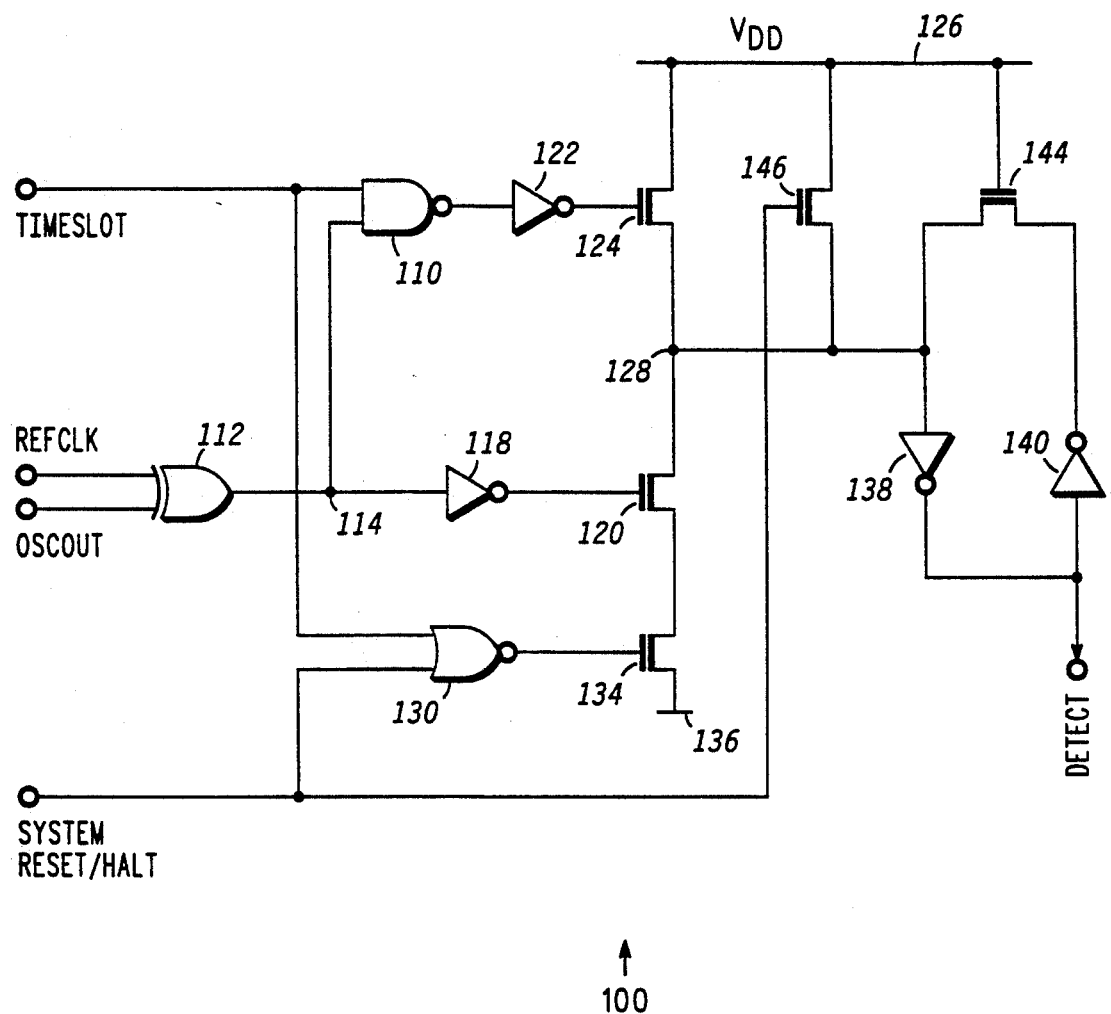
FIG. 4 is a schematic diagram illustrating a lock detection circuit.

Further detail of lock detector circuit 100 is shown in FIG. 4, wherein the TIMESLOT signal is applied at the first input of NAND gate 110 while the REFCLK signal and the OSCOUT signal are applied at the first and second inputs of exclusive-OR gate 112. Node 114 at the output of exclusive-OR gate 112 is coupled to the second input of NAND gate 110 and through inverter 118 to the gate of transistor 120. The output of NAND gate 110 is coupled through inverter 122 to the gate of transistor 124 which includes a drain coupled to power supply conductor 126 operating at a positive potential such as $V_{DD}$ and a source coupled to the drain of transistor 120 at node 128. The TIMESLOT signal and a SYSTEM RESET/HALT signal are applied at the first and second inputs of NOR gate 130, the output of which is applied at the gate of transistor 134 having a drain coupled to the source of transistor 120 and a source coupled to power supply conductor 136 operating at ground potential. Node 128 is also coupled through inverter 138 for providing the DETECT signal at the output of lock detection circuit 100. The output of inverter 138 is coupled through inverter 140 to the drain of transistor 144 which also includes a gate coupled to power supply conductor 126 and a source coupled to node 128. Transistor 144 behaves as a feedback circuit for latching the state of the output signal of inverter 140 back to node 128. The SYSTEM RESET/HALT signal is also applied at the gate of transistor 146 having a drain coupled to power supply conductor 126 and a source coupled to node 128.

Figure 5A:
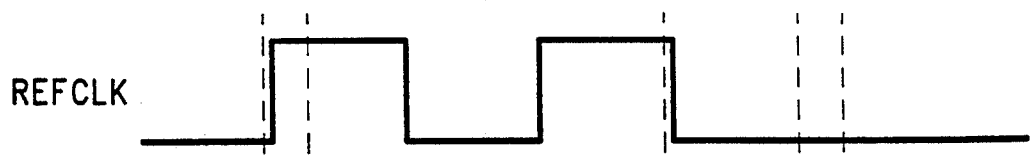
FIGS. 5A-5F are waveform plots illustrating the loss of phase lock.
Figure 5B:
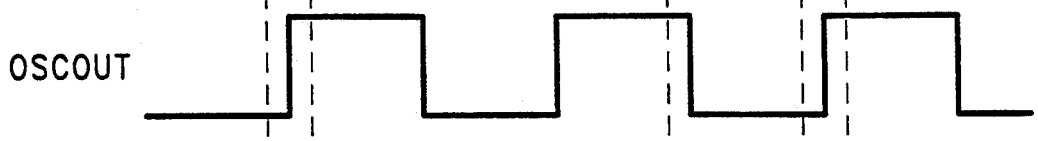
Figure 5C:
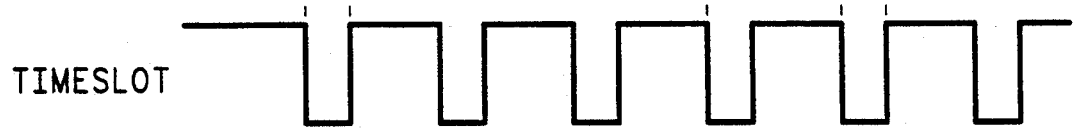

The operation of lock detection circuit 100 may best be understood with the waveform plots of FIGS. 5A-5F which illustrate the occurrence and detection of an out-of-lock condition. Any time the SYSTEM RESET/HALT signal is asserted as logic one, the output of NOR gate 130 becomes logic zero turning off transistor 134 while transistor 146 conducts pulling node 128 to logic one. Asserting the SYSTEM RESET/HALT signal thus drops the DETECT signal a logic zero state. During normal operation just prior to time $t_0$ of FIGS. 5A and 5B, the OSCOUT signal and the REFCLK signal are both logic zero producing a logic zero at node 114 and a logic one at the gate of transistor 120 turning it on. The TIMESLOT signal of FIG. 5C is high before time $t_0$ and the output of NAND gate 110 is logic one turning off transistor 124. The SYSTEM RESET/HALT signal is logic zero for normal operation which, in combination with the logic one TIMESLOT signal, produces a logic zero at the gate of transistor 134, turning it off. The logic zero state of the SYSTEM RESET signal also disables transistor 146.

The TIMESLOT signal becomes logic zero between times $t_0$ and $t_1$ forming the TIMESLOT window. The logic zero SYSTEM RESET/HALT signal and the logic zero TIMESLOT signal produce a logic one at the gate of transistor 134, turning it on and pulling node 128 to a logic zero at power supply conductor 136. The logic zero at node 128 is complemented by inverter 138 producing a logic one for the DETECT signal indicating PLL 10 is in phase lock. The logic zero DETECT signal is inverted again through inverter 140 and fed back through transistor 144 to latch node 128 at logic zero.

Figure 5D:
Figure 5E:
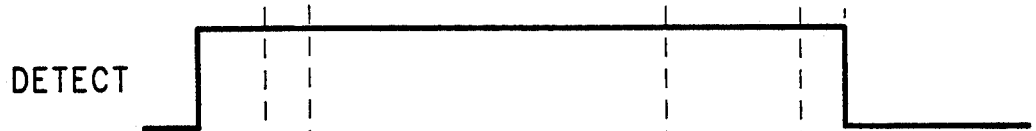
Figure 5F:
Figure 6A:
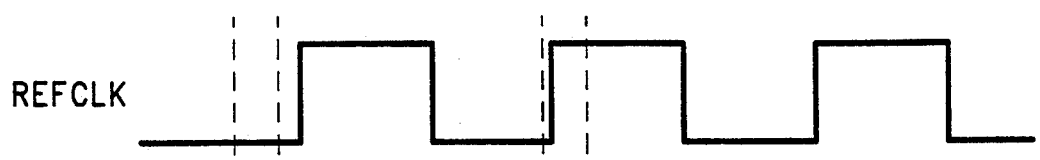
FIGS. 6A-6F are waveform plots illustrating the acquisition of phase lock.
Figure 6B:
Figure 6C:
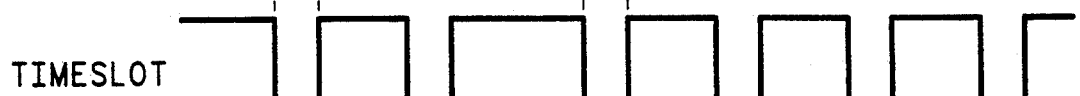
Figure 6D:
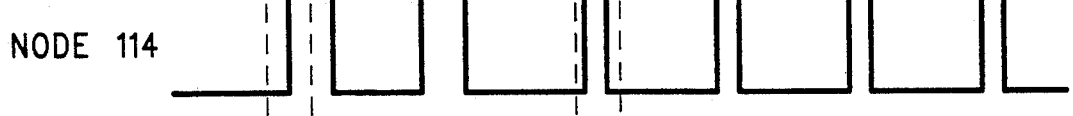
Figure 6E:
Figure 6F:

The REFCLK signal and OSCOUT signal change state between times $t_0$ and $t_1$ during the TIMESLOT window. Any phase difference between the REFCLK signal and the OSCOUT signal produces a logic one pulse at node 114 from the exclusive-OR combination thereof as shown in FIG. 5D. As long as the logic one pulse at node 114 occurs within the TIMESLOT window between time $t_0$ and $t_1$ when the TIMESLOT signal is low, the output signal of NAND gate 110 stays at logic one and transistor 124 remains off. Transistor 120 is momentarily pulsed off by the logic one at node 114, but feedback transistor 144 maintains node 128 at logic zero and the DETECT signal high verifying phase lock for PLL 10.

Such is the case in FIGS. 5A-5F until time $t_2$ when the REFCLK signal disappears simulating a loss of an input clock. As the OSCOUT signal transitions to logic one during the TIMESLOT window between times $t_3$-$t_4$, the width of the logic one pulse at node 114 exceeds the TIMESLOT window producing a logic zero at the output of NAND gate 110 after time $t_4$ and a logic one at the gate of transistor 124 turning it on. Transistor 120 turns off from the logic one at node 114 releasing node 128 allowing it to be pulled high through transistor 124. The DETECT signal is forced to a low state indicating a loss of phase lock for PLL 10. The logic zero DETECT signal shifts into shift register 102 of FIG. 1 at the next SAMPLE_CLOCK signal which drives the LOCK signal at output terminal 106 to a logic zero false state. Thus, the lock detection feature of PLL 10 detects loss of the REFCLK signal and produces a false LOCK signal. The lock detection feature would operate in a similar manner detecting loss of the OSCOUT signal, or a phase difference between the REFCLK signal and the OSCOUT signal greater than the TIMESLOT window.

Now consider the case of the phase lock acquisition shown in FIGS. 6A-6F. Between times $t_0$ and $t_1$ of FIGS. 6A and 6B, the REFCLK signal is substantially out-of-phase with the OSCOUT signal creating a wider pulse at node 114 from the mutually exclusive combination thereof extending beyond time $t_1$ outside the TIMESLOT window of FIG. 6C. The output signal of NAND gate 110 drops low turning on transistor 124, pulling node 128 to a logic one and producing a logic zero DETECT signal in FIG. 6E. Lock detection circuit 100 thus indicates an out-of-lock condition which is reflected in a false LOCK signal at output terminal 106 as described above. Between times $t_1$ and $t_2$, charge pump 16 increases the potential at loop node 18 increasing the output frequency of VCO 24 to bring the OSCOUT signal substantially in-phase with the REFCLK signal. During the TIMESLOT window $t_2$-$t_3$, the pulse width at node 114, see FIG. 6D, reduces to within the TIMESLOT window turning off transistor 124 and turning on transistor 120 to pull node 128 low and issue a true logic one DETECT signal. After the SAMPLE_CLOCK signal of FIG. 6F shifts four logic ones from the DETECT signal into shift register 102, the LOCK signal becomes logic one indicating PLL 10 has achieved phase lock.

Another option for lock detection circuit 100 may include using a non-50% duty cycle REFCLK signal and generating TIMESLOT windows only on the negative edge of the OSCOUT signal. Thus, one need only examine every other edge of the REFCLK signal. The basic operation is still the same in that the transitions of the REFCLK signal and the OSCOUT signal must occur within the TIMESLOT window to verify phase lock.

Hence, what has been provided is a novel lock detection circuit in a PLL which monitors the input signal and the output signal of the VCO and generates a first digital output signal from a mutually exclusive combination thereof. The first digital output signal is compared with a time slot window for generating a true lock detection signal when the first digital output signal activates within the time slot window and a false lock detection signal when the first digital output signal occurs outside the time slot window. Whereas the prior art lock detection circuits focus on the up and down control signals which are merely rough indicators of the phase relationship between the input signals of the phase detector, the present invention directly monitors the transitions of the input signals of the phase detector to ascertain the lock status of the PLL based upon the phase difference thereof relative to the time slot window.

We claim:

1. A lock detection circuit, comprising:
   first means responsive to first and second digital input signals for generating a first digital output signal having a first logic state from a mutually exclusive combination of said first and second digital input signals; and
   second means for comparing said first logic state of said first digital output signal with a time slot window formed by a control signal and generating a true lock detection signal when said first logic state of said first digital output signal occurs within said time slot window and a false lock detection signal when said first logic state of said first digital output signal occurs outside said time slot window, said second means including,
   (a) a NAND gate having first and second inputs and an output, said first input being coupled for receiving said control signal, said second input being coupled for receiving said first digital output signal,
   (b) a first inverter having an input coupled to said output of said NAND gate and having an output,
   (c) a second inverter having an input coupled for receiving said first digital output signal and having an output,
   (d) a first transistor having a gate, a drain and a source, said drain being coupled to a first source of operating potential, said gate being coupled to said output of said first inverter, and
   (e) a second transistor having a gate, a drain and a source, said drain being coupled to said source of said first transistor at a first node, said source being coupled to a second source of operating potential, said gate being coupled to said output of said second inverter.

2. The lock detection circuit of claim 1 wherein said time slot window occurs during a predetermined logic state of said control signal.

3. The lock detection circuit of claim 2 wherein said first means includes an exclusive-OR gate having first and second inputs and an output, said first input being coupled for receiving said first digital input signal, said second input being coupled for receiving said second digital input signal, said output providing said first digital output signal.

4. The lock detection circuit of claim 3 wherein said second means further includes:
   a NOR gate having first and second inputs and an output, said first input being coupled for receiving said control signal, said second input being coupled for receiving a reset signal;
   a third transistor having a gate, a drain and a source, said drain being coupled to said source of said second transistor, said source being coupled to said second source of operating potential, said gate being coupled to said output of said NOR gate;
   a fourth transistor having a gate, a drain and a source, said drain being coupled to said first source of operating potential, said source being coupled to said first node, said gate being coupled for receiving said reset signal;
   a third inverter having an input coupled to said first node and having an output for providing said lock detection signal;
   a fourth inverter having an input coupled to said output of said third inverter and having an output; and
   a fifth transistor having a gate, a drain and a source, said drain being coupled to said output of said fourth inverter, said gate being coupled to said first source of operating potential, said source being coupled to said first node.

5. A phase lock loop, comprising:
   first means for comparing the phase of first and second digital input signals and generating an output signal to charge and discharge a loop node;
   a voltage controlled oscillator having an input coupled for receiving said output signal of said first means and providing a oscillator signal operating at a frequency as determined by said output signal of said first means;
   second means having an input coupled for receiving said oscillator signal from said voltage controlled oscillator and dividing down the frequency thereof for providing said second digital input signal to said first means; and
   a lock detection circuit having first, second and third inputs and an output, said first input being coupled for receiving said first digital input signal, said second input being coupled for receiving said second digital input signal, said third input being coupled for receiving a control signal forming a time slot window, said output providing a true lock detection signal when a mutually exclusive combination of said first and second digital input signals occurs within said time slot window and a false lock detection signal when said mutually exclusive combination of said first and second digital input signals occurs outside said time slot window.

6. The phase lock loop of claim 5 further including filter means coupled to said loop node for low-pass filtering said output signal of said first means.

7. The phase lock loop of claim 6 wherein said second means includes a second output for providing said time slot window during a first logic state of said control signal centered about each transition of said second digital input signal.

8. The phase lock loop of claim 7 wherein said lock detection circuit includes an exclusive-OR gate having first and second inputs and an output, said first input being coupled for receiving said first digital input signal, said second input being coupled for receiving said second digital input signal, said output providing a first digital output signal as said mutually exclusive combination of said first and second digital input signals.

9. The phase lock loop of claim 8 wherein said lock detection circuit further includes:
   a NAND gate having first and second inputs and an output, said first input being coupled for receiving said control signal, said second input being coupled to said output of said exclusive-OR gate;
   a first inverter having an input coupled to said output of said NAND gate and having an output;
   a second inverter having an input coupled to said output of said exclusive-OR gate and having an output;
   a first transistor having a gate, a drain and a source, said drain being coupled to a first source of operating potential, said gate being coupled to said output of said first inverter; and
   a second transistor having a gate, a drain and a source, said drain being coupled to said source of said first transistor at a first node, said source being coupled to a second source of operating potential, said gate being coupled to said output of said second inverter.

10. The phase lock loop of claim 9 wherein said lock detection circuit further includes:
    a NOR gate having first and second inputs and an output, said first input being coupled for receiving said control signal, said second input being coupled for receiving a reset signal;
    a third transistor having a gate, a drain and a source, said drain being coupled to said source of said second transistor, said source being coupled to said second source of operating potential, said gate being coupled to said output of said NOR gate;
    a fourth transistor having a gate, a drain and a source, said drain being coupled to said first source of operating potential, said source being coupled to said first node, said gate being coupled for receiving said reset signal;
    a third inverter having an input coupled to said first node and having an output for providing said lock detection signal;
    a fourth inverter having an input coupled to said output of said third inverter and having an output; and
    a fifth transistor having a gate, a drain and a source, said drain being coupled to said output of said fourth inverter, said gate being coupled to said first source of operating potential, said source being coupled to said first node.

11. The phase lock loop of claim 10 wherein said second means includes a third output for providing a sample clock active prior to said first logic state of said control signal.

12. The phase lock loop of claim 11 further comprising:
    a shift register having a data input, a clock input and a plurality of outputs, said data input being coupled for receiving said lock detection signal from said lock detection circuit, said clock input being coupled for receiving said sample clock signal from said third output of said second means; and
    an AND gate having a plurality of inputs coupled to said plurality of outputs of said shift register and having an output for providing a lock indicator signal.

13. A method of detecting phase lock for a phase lock loop, comprising the steps of:
    comparing a phase difference between a first digital signal and a second digital signal for generating an error signal;
    driving a voltage controlled oscillator with said error signal for generating an oscillator signal;
    dividing down said oscillator signal for providing said second digital signal and a time slot window formed by a control signal;
    generating a first digital output signal having a first logic state from a mutually exclusive combination of said first and second digital signals; and
    comparing said first logic state of said first digital output signal with said time slot window and generating a true lock detection signal when said first logic state of said first digital output signal occurs within said time slot window and a false lock detection signal when said first logic state of said first digital output signal occurs outside said time slot window.

14. The method of claim 13 wherein said time slot window occurs during a predetermined logic state of said control signal.

* * * * *